United States Patent [19]
Ghoshal

[11] Patent Number: 5,867,990
[45] Date of Patent: Feb. 9, 1999

[54] THERMOELECTRIC COOLING WITH PLURAL DYNAMIC SWITCHING TO ISOLATE HEAT TRANSPORT MECHANISMS

[75] Inventor: Uttam Shyamalindu Ghoshal, Austin, Tex.

[73] Assignee: International Business Machines Corporation, Armonk, N.Y.

[21] Appl. No.: 988,429

[22] Filed: Dec. 10, 1997

[51] Int. Cl.$^6$ .................................................. F25B 21/02
[52] U.S. Cl. ................................ 62/3.7; 62/383; 165/185
[58] Field of Search ......................... 62/3.2, 3.3, 3.7, 62/183, 383; 165/277, 185

[56] References Cited

U.S. PATENT DOCUMENTS

| | | | |
|---|---|---|---|
| 4,304,294 | 12/1981 | Reisman et al. | 165/277 |
| 5,720,171 | 2/1998 | Osterhoff et al. | 62/3.2 |

*Primary Examiner*—John M. Sollecito
*Attorney, Agent, or Firm*—Casimer K. Salys

[57] ABSTRACT

Apparatus and method for sub-ambient cooling using thermoelectric element dynamics in conjunction with pulsed electrical power and multiple selectively enabled thermal switches. In one form, Peltier devices are dynamically enabled using pulses of electrical power while the thermal paths, between the cold and hot sides of the device are selectively switched conduction state responsive to the temperature dynamics within the Peltier device. Switched coupling of the thermal connections in relative synchronism to the Peltier device electrical and thermal dynamics materially improves efficiency by decoupling Joule heating and conductive heat transfer losses otherwise affecting the net heat transfer. Preferable implementations utilizes MEMS to accomplish the selective switching, whereby sub-ambient cooling capacity is increased by parallel operation of multiple Peltier devices and MEMS switches.

34 Claims, 7 Drawing Sheets

NO COMPRESSOR
NO EVAP. COILS
NO COND. COILS
NO CFC

FIG. 9
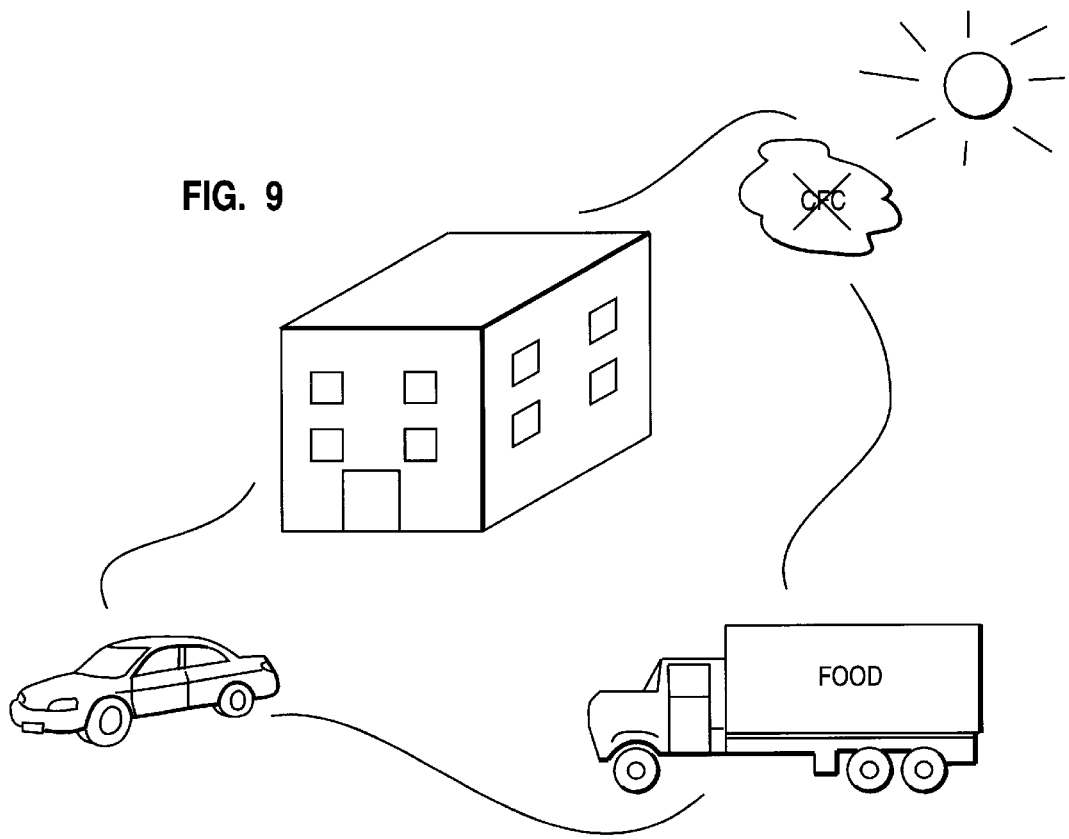
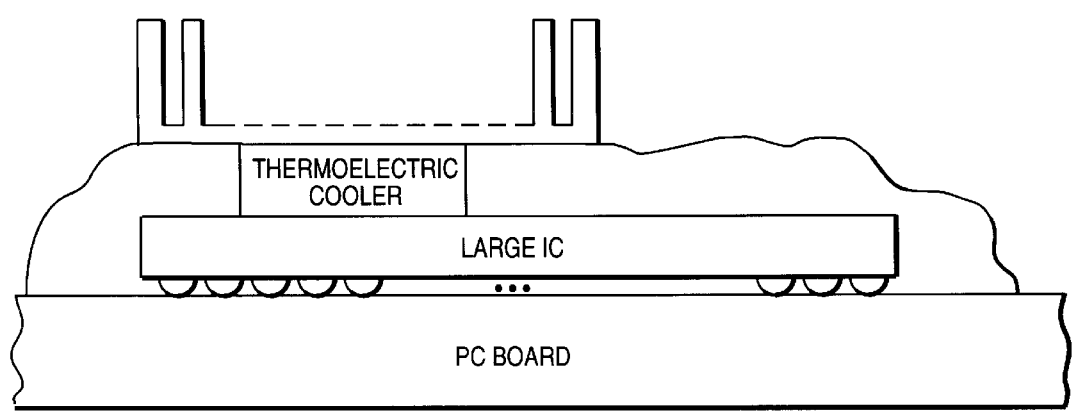
FIG. 10

THERMOELECTRIC COOLING WITH PLURAL DYNAMIC SWITCHING TO ISOLATE HEAT TRANSPORT MECHANISMS

CROSS-REFERENCE TO RELATED APPLICATIONS

The present application is related to co-pending U.S. patent application Ser. No. 08/988621 filed Dec. 10, 1997 and assigned to the assignee of the present application.

FIELD OF THE INVENTION

The present invention generally relates to cooling systems. More particularly, the invention is directed to systems attaining high relative efficiency thermoelectric cooling through the application of selectively switched electrical power and selectively switched thermal coupling concepts and configurations.

BACKGROUND OF THE INVENTION

Sub-ambient cooling is conventionally accomplished through gas/liquid vapor compression based refrigeration cycles using Freon type refrigerants to implement the heat transfers. Such refrigeration systems are used extensively for cooling human residences, foods, and vehicles. Sub-ambient cooling is also often used with major electronic systems such as mainframe computers. Though vapor compression cooling can be very efficient, it does require significant moving hardware, including at a minimum, a compressor, a condenser, an evaporator, and related coolant transfer plumbing. As a result of the complexity and associated high cost, vapor compression cooling has not found material acceptance in small cooling applications, for example personal computers.

The fact that CMOS logic can operate materially faster as the temperature decreases has been well known for at least ten years. For example, if CMOS logic devices are operated at −50° C., the performance is improved by 50 percent over room ambient temperature operation. Liquid nitrogen operating temperatures, in the range of −196° C., have shown 200 percent performance improvements. Similar benefits have shown to accrue for integrated circuit wiring, where metal wiring resistances decrease by a factor of 2 for integrated circuits operated at −50° C. in comparison to room ambient operation. This improvement rivals the recent technological breakthrough of using copper wiring in integrated circuits to reduce interconnect resistance and thereby effectively increase the operating frequencies attainable. Thus, sub-ambient operation of integrated circuit logic devices, such as field effect transistors, as well as the interconnect wiring can materially improve the integrated circuit performance, leaving the question of how to accomplish such cooling in the confines of an ever decreasing size and materially shrinking cost environment.

Thermoelectric cooling is one alternative that has found some usage given the compact size of the prevalently used Peltier devices. Peltier device thermoelectric cooling is also very reliable in that the cooling is totally solid state. The key negative aspect of thermoelectric cooling is the inefficiency, wherein a Peltier device cooling system efficiency is commonly only in the range of 20 percent for a relatively nominal temperature drop between the cold sink and the ambient. For example to cool at the rate of one watt at a sub-ambient temperature of 0° C. the Peltier cooling system must be powered with 5 watts. As the amount of heat to be transferred increases, the total power to be dissipated into the ambient mandates large convection devices and high output power supply circuits. Therefore, Peltier device thermoelectric cooling has not been considered a broadly applicable technology for improving integrated circuit performance.

To understand how the present invention improves thermoelectric cooling efficiency it is necessary to understand why Peltier device thermoelectric cooling is inefficient. A Peltier device is fabricated from semiconductor material such as bismuth telluride or lead telluride. Though new materials are now being evaluated in various universities, they have yet to reach fruition. The commonly used Peltier materials exhibit very high electrical conductivity and relatively low thermal conductivity, in contrast to normal metals which have both high electrical and thermal conductivity. In operation the Peltier devices transport electrons from a cold sink, at temperature $T_{cold}$, to a hot sink, at temperature $T_{hot}$, in response to an electric field formed across the Peltier device. However, there are other mechanisms affecting Peltier device efficiency, which mechanisms degrade the net transport of the heat energy from the cold sink to the hot sink.

FIG. 1 schematically depicts a conventional Peltier type thermoelectric element (TE) 1 with DC power supply 2 created the electric field across TE 1 while at a load current 3. The desired heat transfer is from cold sink 4, at temperature $T_{cold}$, to hot sink 6, at temperature $T_{hot}$. As indicated in the equation of FIG. 1, the net heat energy transported is composed of three elements, the first representing the Peltier effect (thermoelectric) contribution, the second defining negative Joule heating effects, and the third defining negative conductivity effects. The thermoelectric component is composed of the Seebeck coefficient, the temperature of operation ($T_{cold}$) and the current being applied. The Joule heating component reflects that roughly half the Joule heating goes to the cold sink and remainder to the hot sink. Lastly, the negative component attributable to thermal conduction represents the heat flow through the Peltier device, as defined by the thermal conductivity of the Peltier device, from the hot sink to the cold sink. See equation (1).

$$q = \alpha T_{cold} I - \tfrac{1}{2} I^2 R - K\Delta T \qquad (1)$$

Since the thermoelectric component of the heat transport increases in direct proportion to the current, while the Joule heating increases in proportion to the square of the current, and the thermal conduction is in direct proportion to the hot sink to cold sink temperature difference, the equation clearly reflects how quickly the Peltier device becomes inefficient.

Equation (2) defines a coefficient of performance for the Peltier device. The coefficient is the ratio of the net heat energy transported at low temperature to the power consumed in the Peltier device. For a typical bismuth telluride material Peltier device, the coefficient of performance is less than 0.3.

$$\eta = \frac{\alpha T_{cold} I - 1/2 I^2 R - K\Delta T}{I^2 R + \alpha I \Delta T} \qquad (2)$$

Note that the numerator of equation (2) represents the net cooling capability of the Peltier device. The denominator of equation (2) represents the total energy provided by external power source 2. The individual elements of the numerator were described earlier. The first term in the denominator is the total Joule heating, while the second term is the heat energy transport work done by the Peltier device in moving energy from the $T_{cold}$ sink to the $T_{hot}$ sink. Based upon this relationship, the maximum coefficient of performance possible in the configuration of FIG. 1 is given by equation (3).

$$\eta_{max} = \left(\frac{T_{cold}}{\Delta T}\right)\left(\frac{\gamma - \frac{T_{hot}}{T_{cold}}}{\gamma + 1}\right) \qquad (3)$$

The parameter γ can be expressed in terms of the Seebeck coefficient α, electrical conductivity σ and thermal conductivity λ as set forth in equation (4).

$$\gamma = \sqrt{1 + \frac{\gamma^2}{RK}\left(\frac{T_{hot}+T_{cold}}{2}\right)} = \sqrt{1 + \frac{\alpha^2\sigma}{\lambda}\overline{T}} \qquad (4)$$

$$= \sqrt{1 + Z\overline{T}}$$

Note that the first factor in equation (3) is the Carnot efficiency, which is the maximum efficiency possible for any heat pump operating between two temperature sinks $T_{cold}$ and $T_{hot}$. The second factor represents the non-ideal thermoelectric cooling, which can also be characterized by a figure of merit $Z\overline{T}$.

Note that $\eta_{max} \rightarrow (T_{cold}/\Delta T)$ as $\gamma \rightarrow \infty$.

To date it has been very difficult to develop a thermoelectric material which yields high values of $Z\overline{T}$. The prevalent materials for thermoelectric coolers have been bismuth telluride ($Bi_2Te_3$) and lead tellurium (PbTe). These materials have $Z\overline{T}$ values of approximately 0.3 at room temperature. Recent work at universities has shown that $Z\overline{T}$ values approaching 1 may be possible in lead tellurium quantum wells and multilattices. However, even with these materials, the thermoelectric cooling is not competitive with mechanical vapor compression cooling systems.

Another constraint of Peltier device cooling is the limited temperature excursion below ambient attainable. That limitation arises from the fact that temperature span is constrained by efficiency, a parameter which degrades quickly as the temperature differential increases. The maximum temperature differential possible $T_{max}$ is given by equation (5).

$$\Delta T_{max} = \frac{1}{2} Z T^2_{cold} \qquad (5)$$

For bismuth telluride having a $Z\overline{T}$ of approximately 0.3, $T_{max}$ is 45° K. at 300° K.

Thus, there are a number of very fundamental constraints on efficiency and differential temperature that limit the use of conventional thermoelectric elements for sub-ambient cooling applications.

SUMMARY OF THE INVENTION

The present invention overcomes the fundamental constraints of conventional thermoelectric element cooling through the application of multiple switch dynamic modulation to electrical power and thermally conductive paths connecting the thermoelectric element to the power supply and cold sink, respectively.

In one form, the invention relates to a thermoelectric cooling apparatus, comprising a first thermal sink of a first nominal temperature, a second thermal sink of a second nominal temperature, the second temperature being relatively greater than the first temperature, a thermoelectric element situated to be coupled to the first and second thermal sinks, first means for selectively switching a thermal coupling between the thermoelectric element and the first thermal sink, second means for selectively switching a thermal coupling between the thermoelectric element and the second thermal sink, and means for selectively enabling a voltage across the thermoelectric element.

In another form, the invention relates to a thermoelectric cooling apparatus operable in an ambient, comprising a first thermal sink means for dissipating thermal energy at a temperature above the ambient, a second thermal sink means for absorbing thermal energy at a temperature below the ambient, a thermoelectric element situated to be coupled to the first thermal sink and to the second thermal sink for the transport of thermal energy therebetween, first means for selectively switching the thermal conductance of the coupling between the thermoelectric element and the first thermal sink, second means for selectively switching the thermal conductance of the coupling between the thermoelectric element and the second thermal sink, and means for selectively enabling the thermoelectric element in relative synchronism with the second means for selectively switching.

In a still further form, the invention relates to a method of operating a thermoelectric cooling apparatus having a first thermal sink operable at a first nominal temperature, a second thermal sink operable at a second nominal temperature relatively greater than the first nominal temperature, and a thermoelectric element situated to be coupled to the first and second thermal sinks, comprising the steps of selectively switching the transmission of thermal energy between the thermoelectric element and the first thermal sink, selectively switching the transmission of thermal energy between the thermoelectric element and the second thermal sink, and selectively enabling a voltage across the thermoelectric element.

In a still further form, the invention relates to a method of operating a thermoelectric cooling apparatus having a first thermal sink for dissipating thermal energy at a temperature above an ambient, a second thermal sink for absorbing thermal energy at a temperature below the ambient, and a thermoelectric element situated to be coupled between the first and second thermal sinks to transport thermal energy therebetween, comprising the steps of selectively switching the thermal conductance of the coupling between the thermoelectric element and the first thermal sink, selectively switching the thermal conductance of the coupling between the thermoelectric element and the second thermal sink, and selectively enabling the thermoelectric element in relative functional synchronism with the selective switching steps.

In a particularized form of the invention, a thermoelectric element is coupled through electrical and thermal switches operable in a pulsed mode to a hot sink on one side and a cold sink on the other side. Selective but relatively synchronized operation of the switches provides thermal energy transport from the cold sink, through a first switch, through the thermoelectric element, through the second switch, and to the hot sink, at an efficiency exceeding the static mode operation of such thermoelectric element. The use of transient principles allows the relative isolation of the thermoelectric heat transport mechanisms from the thermal conduction and Joule heating mechanisms.

These and other features of the invention will be more clearly understood and appreciated upon considering the detailed embodiments described hereinafter.

BRIEF DESCRIPTION OF THE DRAWINGS

FIG. 9 schematically depicts potential applications and benefits of the invention as applied to various human residences and transportation media.

FIG. 10 schematically depicts the application of a small thermoelectric cooler to locally cool a selected part of an integrated circuit chip.

DESCRIPTION OF THE PREFERRED EMBODIMENT

Figure 1:
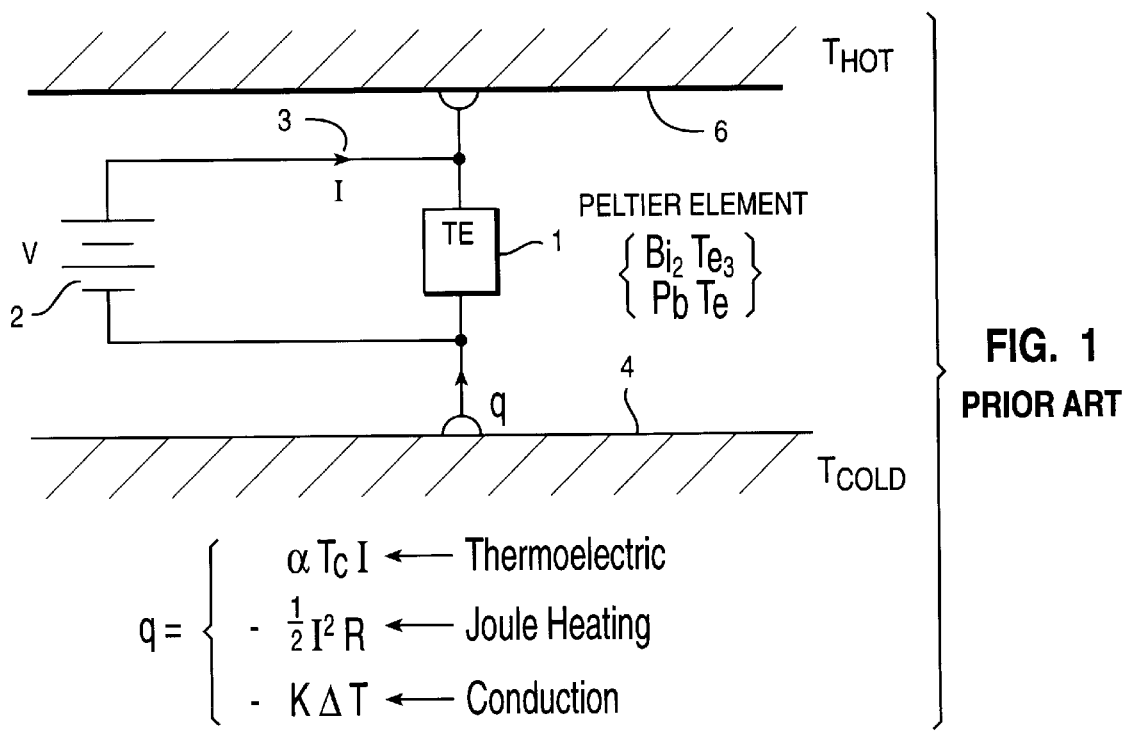
FIG. 1 schematically depicts a conventional statically operable Peltier device cooling system.

The conceptual groundwork for the present invention involves a separate of the dependency between thermal conductivity and electrical conductivity, a dependency which has heretofore limited the temperature differential and efficiency of conventional thermoelectric element heat transfers. Mathematically, the objective is to effectively isolate the elements contributing to net heat transfer relationship specified in FIG. 1 through the use of thermoelectrical switches to dynamically maximize thermoelectric heat transfer while minimizing Joule heating and conduction heat transfer. Thermoelectric element transient effects are used to increase efficiency by synchronizing the pulsed voltage applied across the thermoelectric element and the switched thermal conductivity coupling between the cold side of the thermal electric element and the cold sink. In a preferred implementation, the switching of thermal conductivity is accomplished using microelectromechanical systems (MEMS) thermal switches, wherein arrays of multiple miniature thermoelectric elements and related MEMS thermal conductivity switches are used to increase heat transfer capacity.

Figure 2:
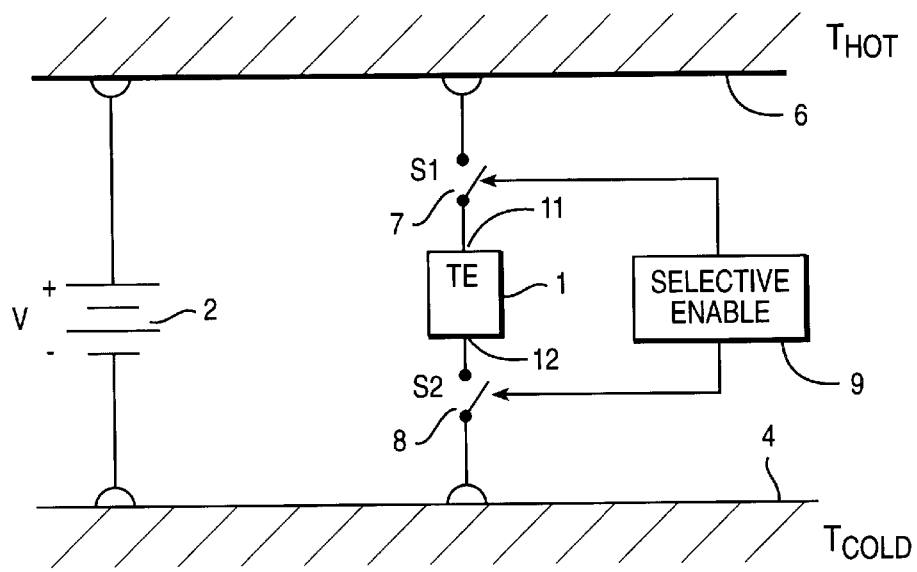
FIG. 2 schematically depicts a generalized two switch, single thermoelectric element embodiment of the invention.

FIG. 2 schematically depicts a minimum element configuration of the invention. Thermoelectric element 1 is selectively coupled to hot sink 6 through S1 switch 7 and selectively coupled through S2 switch 8 to cold sink 4. Switches 7 and 8 are dual function in that they provide both electrical and thermal conduction, the electrical conduction to provide a current flow from power supply 2 and thermal conduction to transfer heat energy from cold sink 4 to hot sink 6 responsive to the effects of thermal electric element 1. As embodied in FIG. 2, controller 9 selectively actuates switches 7 and 8. The closure of both switches 7 and 8 allows the conduction of electrical current through thermoelectric element 1 and produces an associated relative temperature differential between hot end 11 and cold end 12 of thermoelectric element 1. During that transient interval, thermal conduction through switch 8 extracts heat from cold sink 4. With time the Joule heating thermal conductivity effects within thermoelectric element 1 transition to the point where the net heat transfer begins to decrease. At such optimized point in time switch 8 is opened, thermally decoupling cold sink 4 from thermoelectric element 1. In contrast, switch 7 remains closed to dissipate the residual energy at hot end 11 of thermoelectric element 1 to hot sink 6, with a temperature of thermoelectric element 1 eventually equalizing at an exponential rate of decaying to the level of hot sink 6. Switch 7 is then opened, and the cycle is repeated. Controller 9 can operate switch 7 and 8 in conformance to a timed sequence or can be made responsive to temperature sensors situated on thermoelectric element 1 and the sinks.

Figure 3:
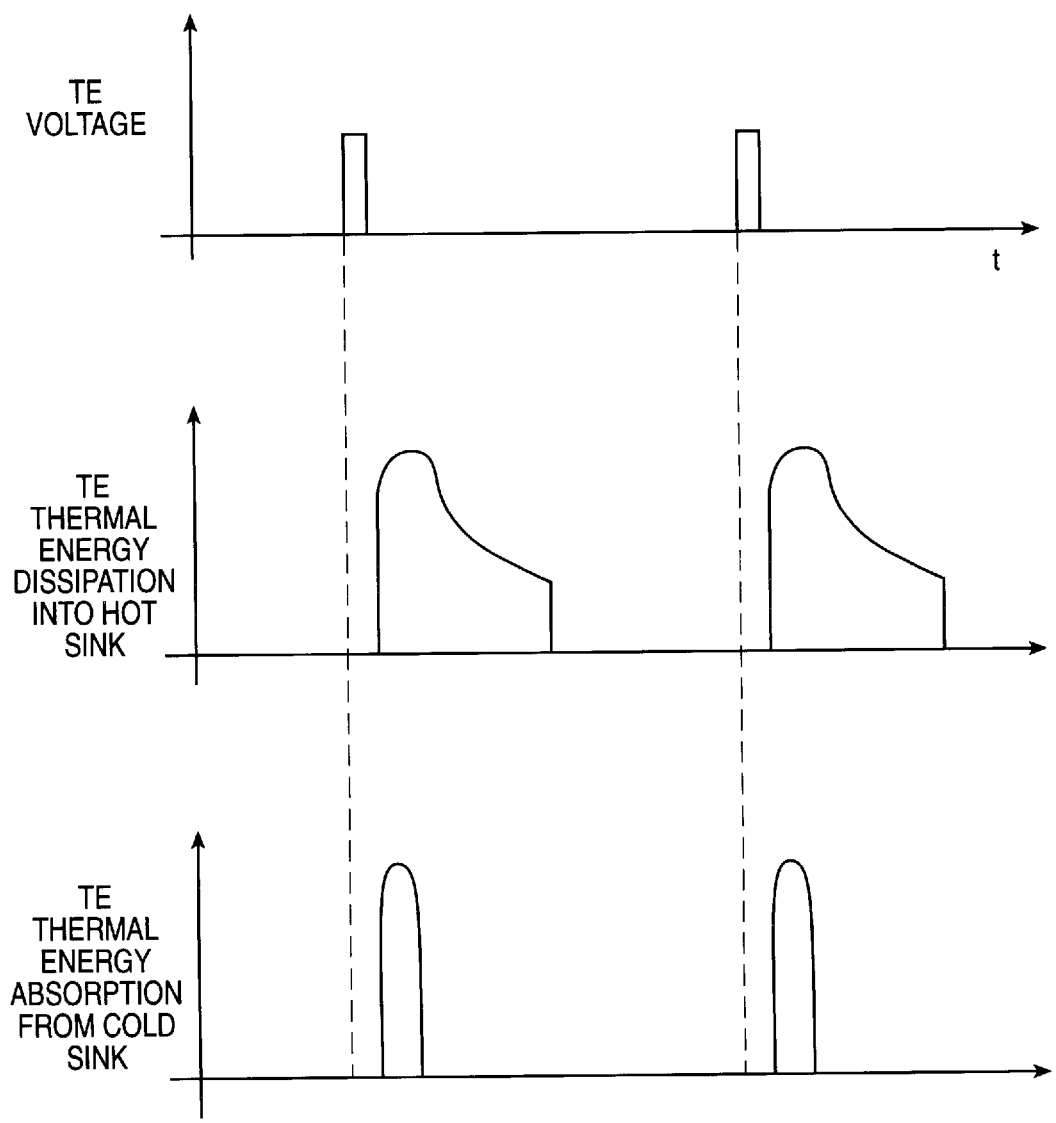
FIG. 3 schematically depicts relative time plots of the electrical power and the thermal energy transports per the embodiment in FIG. 2.

FIG. 3 schematically depicts by plots illustrative voltage and thermal energy transport waveforms associated with the operation of the embodiment in FIG. 2. The first plot shows the pulsed nature of the voltage applied across the thermoelectric elements. The second plot illustrates the thermal transient and associated decay of the thermal energy dissipated into the hot sink. The last plot illustrates the thermal energy absorption from the cold sink through the thermal switch connected to the cold sink. The plots in FIG. 3 are intended merely to illustrate general concepts rather than to portray particularized magnitudes or specific time relationships.

Figure 4:
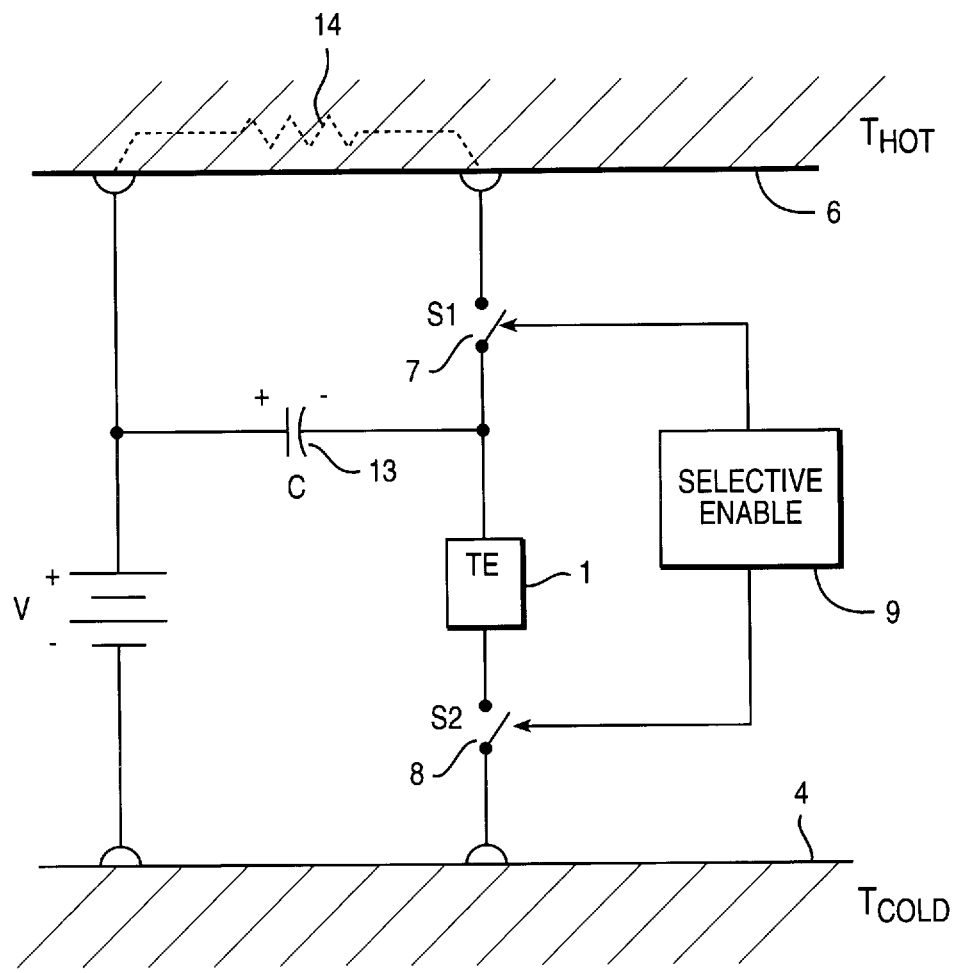
FIG. 4 schematically depicts a two switch capacitive implementation of the embodiment in FIG. 2.

The embodiment in FIG. 4 introduces a refinement allowing a degree of isolation between the electrical pulse and the thermal heat transfer functions initiated by switches 7 and 8. In particular, the duration of the current pulse initiated by the closure of switch 8 is defined by the exponential decay introduced by capacitor 13, thereby allowing switch 8 to perform thermal conduction after the electrical current flow through thermoelectric element 1 has effectively subsided. The charge stored in capacitor 13 is dissipated through a simple resistive implementation linked to hot sink 6, such as functionally depicted by resistor 14. The key refinement introduced by the embodiment in FIG. 4 is the separation of the electrical and thermal conduction through cold sink side switch 8. The cost, however, involves a decrease in efficiency attributable to the power dissipated in resistive element 14.

Figure 5:
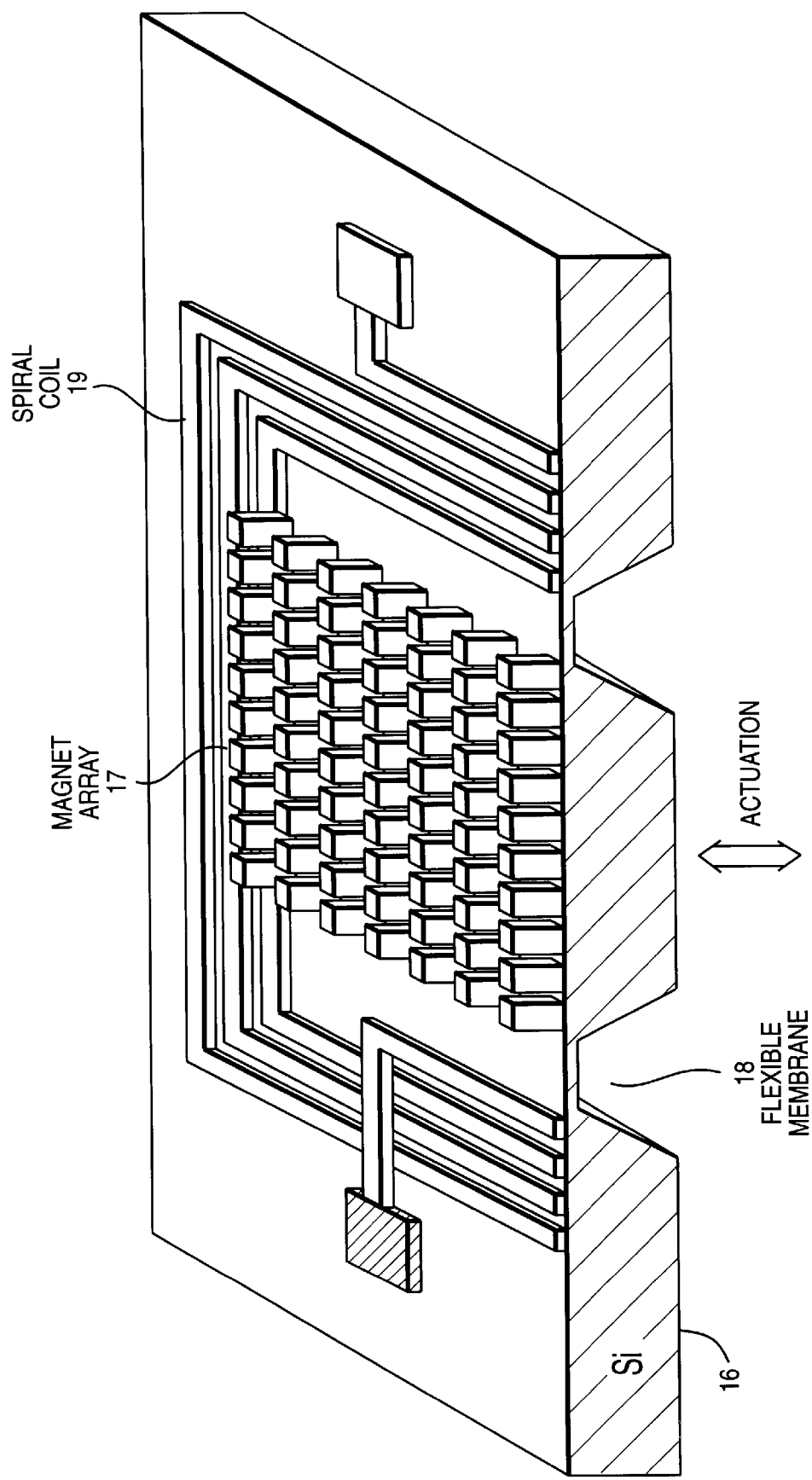
FIG. 5 schematically depicts a microelectromechanical systems (MEMS) device.

FIG. 5 schematically illustrates the structure of a representative microelectromechanical systems (MEMS) switch of the type particularly suited to the present invention. Since MEMS technology is still in its infancy, the switch depicted in FIG. 5 merely illustrates one of many potential switch configurations suitable to provide a selective electrical and thermal coupling between the thermoelectric element and the sinks. The switch shown in FIG. 5 is fabricated using conventional integrated circuit techniques so as to form on a surface of silicon chip 16 an array of nickel magnets 17 amenable to a slight displacement by movement at thin flexible membranes 18. Introduction of an electrical current into spiral coil 19 produces a force adequate to translate the magnetic array in a direction perpendicular to the plane of the silicon chip. The MEMS switch in FIG. 5 should have a relatively low thermal conductivity when opened yet a relatively high electrical and thermal conductivity when closed by actuation. Since the MEMS device in FIG. 5 is to accomplish both electrical and thermal switching, numerous evolutionary refinements are expected to accentuate the dual functions.

Figure 6:
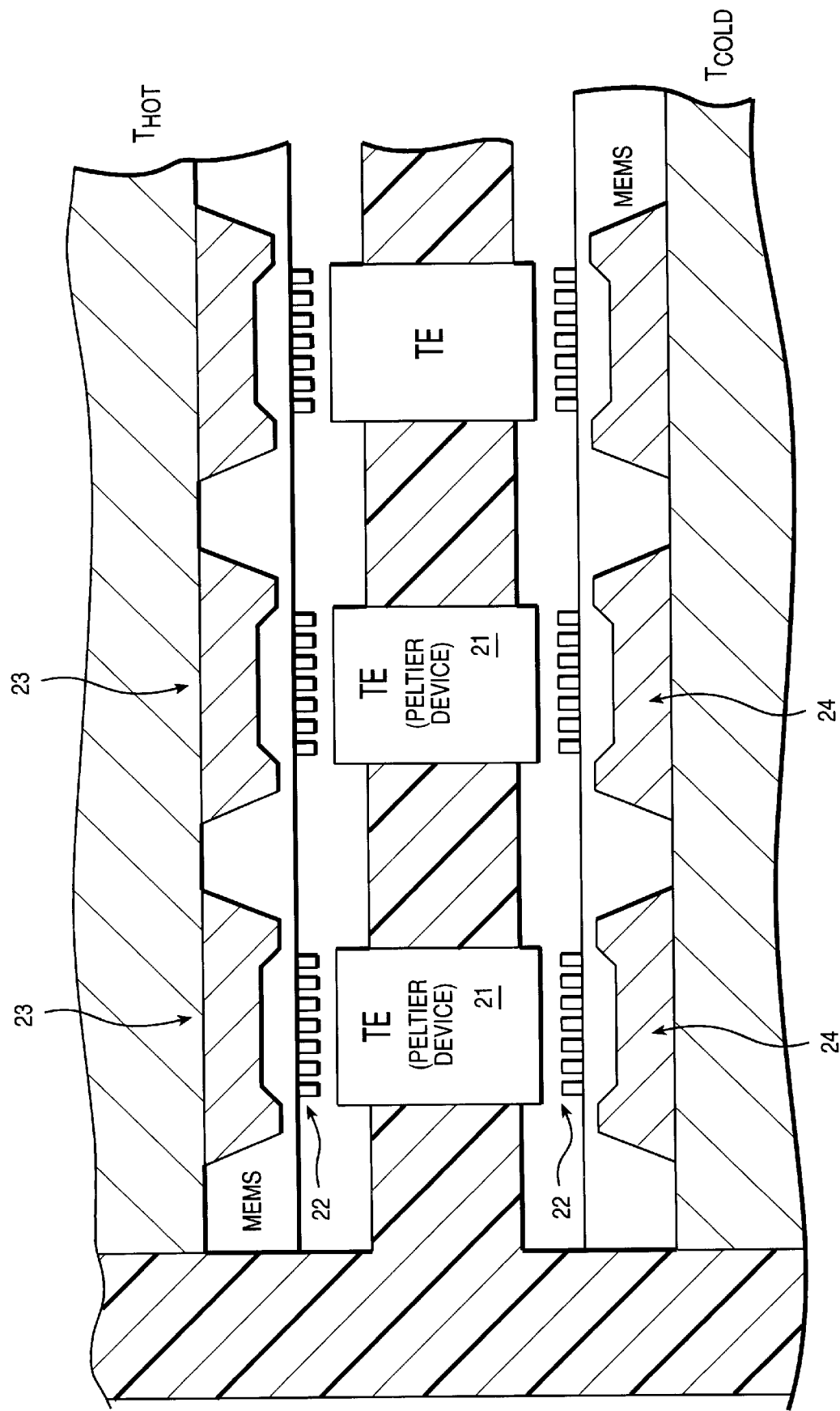
FIG. 6 depicts by schematic cross-section an array of MEMS devices and Peltier type thermoelectric elements.

FIG. 6 illustrates the use of an array of MEMS devices to selectively establish electrical and thermal connections between the Peltier type thermoelectric devices and sinks in keeping with the functional depiction in FIG. 2. The spacing between thermoelectric elements 21 and magnetic arrays 22 of hot and cold sink MEMS switches 23 and 24, respectively, is expected to be in the nominal range of half a micron. This dimension is expected to allow a nominal size electrical coil 19 (FIG. 5) to initiate actuation of the switch structures. Since switch cycling is expected to occur in the order of seconds, the reliability associated with kilohertz frequency switching of MEMS devices should not be a problem.

The MEMS type thermal switch described with reference to the illustrations in FIGS. 5 and 6 is merely one of many potential switch configurations. For example, it is fully contemplated that electrostatic forces generated in capacitive switch structures could be used to accomplish similar objectives. The underlying goal for all the switches is to maximize the thermal conductivity extremes for switch positions, such that when the switch is closed the thermal path between the thermoelectric element and the sink has a maximum thermal conductance while for the open switch the thermal conductance is the minimum attainable, while minimizing electrical conduction Joule heating and maximizing the extremes of the electrical switch states.

The depiction in FIG. 6 portrays that the thermoelectric cooling system of the present invention is preferably composed of plural thermoelectric elements and MEMS switches configured in arrays. The multiplicity of thermoelectric elements and switches ensures that the transient characteristics which underlie the present invention can be achieved within the dimensions of the thermoelectric element and switch materials. Stated otherwise, it is expected that the isolation of the thermoelectric heat transfer from the Joule heating and conduction components is most effectively accomplished with relatively small thermal capacity thermoelectric elements, commonly Peltier devices, and correspondingly small MEMS type switches.

Figure 7:
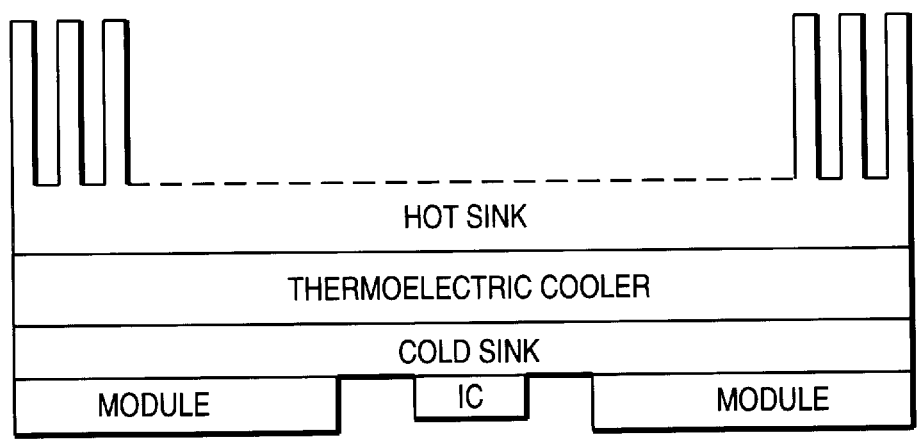
FIG. 7 schematically depicts a thermoelectric cooler as may be used to sub-ambient cool integrated circuits and electronic modules.

FIG. 7 schematically depicts one application for the thermoelectric cooler of the present invention. In this case, the cooler is situated between a heat sink dissipating power into an air ambient and a cold sink having electronic modules and integrated circuits attached thereto.

Figure 8:
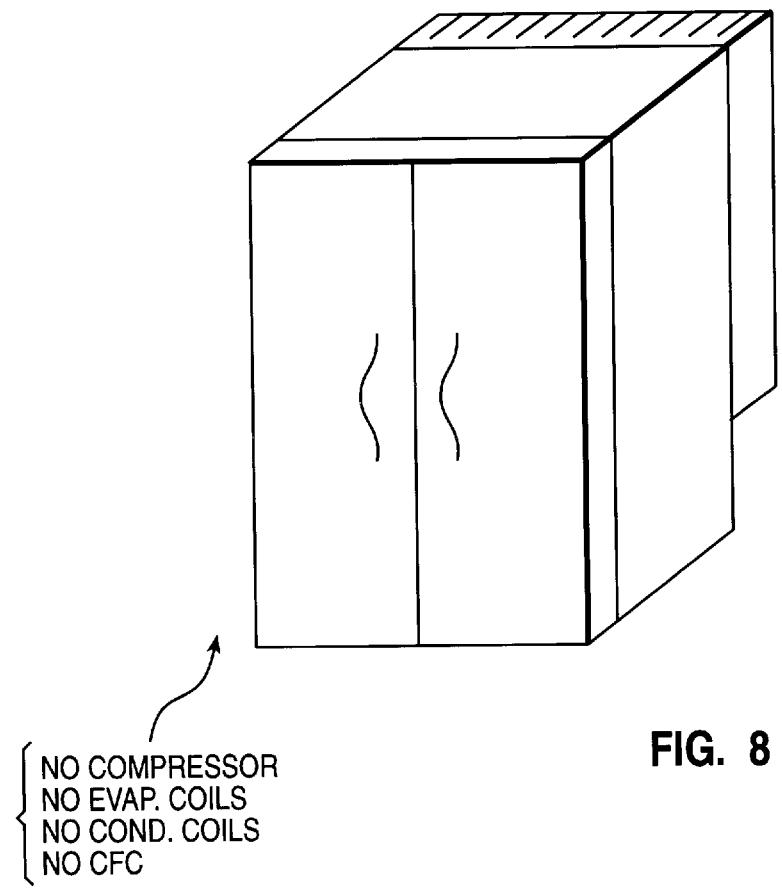
FIG. 8 schematically depicts the extended use of the invention to a food refrigeration system.

FIG. 8 schematically illustrates the use of the thermoelectric cooler in an extended array form to efficiently and cleanly operate a food refrigerator. The high efficiency and lack of major moving parts characterizing the present invention facilitates the migration of thermoelectric cooling from highly selective and limited applications, such as small portable coolers, to major appliances in substantially every home.

Still further applications are schematically depicted in FIG. 9, as the concepts underlying the present invention are further refined and extended in size to encompass major heat transfer applications encompassing residential and office cooling, food transportation systems, and personal vehicle cooling.

FIG. 10 schematically illustrates an application somewhat at the other end of the spectrum, where micro size thermoelectric coolers are selectively bonded to parts of an integrated circuit chip for purposes of selective region cooling to control integrated circuit parameters. Such localized or spot cooling applications are particularly useful for voltage controlled oscillators, phase detectors, mixers, low noise amplifiers, lasers, photodiodes, and various material type optoelectric circuits.

The present invention has very broad applicability in part because it is not constrained to specific thermoelectric materials or electronic configurations. The invention utilizes the thermal dynamics of pulse operated thermoelectric elements in combination with miniature electrical and thermal switches to isolate heat transfer characteristics and attain higher cooling efficiency.

It will be understood by those skilled in the art that the embodiment set forth hereinbefore merely exemplary of the numerous arrangements for which the invention may be practiced, and as such may be replaced by equivalents without departing from the invention which will now be defined by appended claims.

I claim:
1. A thermoelectric cooling apparatus, comprising:
a first thermal sink of a first nominal temperature;
a second thermal sink of a second nominal temperature, the second temperature being relatively greater than the first temperature;
a thermoelectric element situated to be coupled to the first and second thermal sinks;
first means for selectively switching a thermal coupling between the thermoelectric element and the first thermal sink;
second means for selectively switching a thermal coupling between the thermoelectric element and the second thermal sink; and
means for selectively enabling a voltage across the thermoelectric element.

2. The apparatus recited in claim 1, wherein the first and second means for selectively switching are operable in functional synchronism.

3. The apparatus recited in claim 2, wherein the first and second means for selectively switching include electrical switching resources.

4. The apparatus recited in claim 3, wherein the thermoelectric element is a Peltier device.

5. The apparatus in claim 4, wherein the first or second means for switching include at least one microelectromechanical system (MEMs) device.

6. The apparatus recited in claim 3, wherein the duty cycle of the voltage correlates with the duty cycle of the first means for selectively switching.

7. The apparatus recited in claim 4, wherein the duty cycle of the voltage correlates with the duty cycle of the first means for selectively switching.

8. The apparatus recited in claim 5, wherein the duty cycle of the voltage correlates with the duty cycle of the first means for selectively switching.

9. The apparatus recited in claim 3, wherein the duty cycle of the first means for selectively switching is materially smaller than the duty cycle of the second means for selectively switching.

10. The apparatus recited in claim 4, wherein the duty cycle of the first means for selectively switching is materially smaller than the duty cycle of the second means for selectively switching.

11. The apparatus recited in claim 5, wherein the duty cycle of the first means for selectively switching is materially smaller than the duty cycle of the second means for selectively switching.

12. A thermoelectric cooling apparatus operable in an ambient, comprising:
a first thermal sink means for dissipating thermal energy at a temperature above the ambient;
a second thermal sink means for absorbing thermal energy at a temperature below the ambient;
a thermoelectric element situated to be coupled to the first thermal sink and to the second thermal sink for the transport of thermal energy therebetween;
first means for selectively switching the thermal conductance of the coupling between the thermoelectric element and the first thermal sink;
second means for selectively switching the thermal conductance of the coupling between the thermoelectric element and the second thermal sink; and
means for selectively enabling the thermoelectric element in relative synchronism with the second means for selectively switching.

13. The apparatus recited in claim 12, wherein the first and second means for selectively switching include electrical switching resources.

14. The apparatus recited in claim 13, wherein the thermoelectric element is a Peltier device.

15. The apparatus recited in claim 12, wherein the first and second means for switching include at least one microelectromechanical system (MEMs) device.

16. The apparatus recited in claim 13, wherein the first and second means for switching include at least one microelectromechanical system (MEMs) device.

17. The apparatus recited in claim 14, wherein the first and second means for switching include at least one microelectromechanical system (MEMs) device.

18. The apparatus recited in claim 15, wherein the dissipating of thermal energy is into the ambient, and the absorbing of thermal energy is from a food refrigeration system.

19. The apparatus recited in claim 16, wherein the dissipating of thermal energy is into the ambient, and the absorbing of thermal energy is from a food refrigeration system.

20. The apparatus recited in claim 17, wherein the dissipating of thermal energy is into the ambient, and the absorbing of thermal energy is from a food refrigeration system.

21. The apparatus recited in claim 15, wherein the dissipating of thermal energy is into the ambient, and the absorbing of thermal energy is from a vehicle occupant cooling system.

22. The apparatus recited in claim 16, wherein the dissipating of thermal energy is into the ambient, and the absorbing of thermal energy is from a vehicle occupant cooling system.

23. The apparatus recited in claim 17, wherein the dissipating of thermal energy is into the ambient, and the absorbing of thermal energy is from a vehicle occupant cooling system.

24. The apparatus recited in claim 15, wherein the dissipating of thermal energy is into the ambient, and the absorbing of thermal energy is from an integrated circuit device.

25. The apparatus recited in claim 16, wherein the dissipating of thermal energy is into the ambient, and the absorbing of thermal energy is from an integrated circuit device.

26. The apparatus recited in claim 17, wherein the dissipating of thermal energy is into the ambient, and the absorbing of thermal energy is from an integrated circuit device.

27. A method of operating a thermoelectric cooling apparatus have a first thermal sink operable at a first nominal temperature, a second thermal sink operable at a second nominal temperature relatively greater than the first nominal temperature, and a thermoelectric element situated to be coupled to the first and second thermal sinks, comprising the steps of:

selectively switching the transmission of thermal energy between the thermoelectric element and the first thermal sink;

selectively switching the transmission of thermal energy between the thermoelectric element and the second thermal sink; and selectively enabling a voltage across the thermoelectric element.

28. The method recited in claim 27, wherein the steps of selectively switching and selectively enabling are accomplished in functional synchronism.

29. The method recited in claim 28, wherein at least one of the steps of selectively switching are accomplished with a microelectromechanical system (MEMs) device.

30. The method recited in claim 29, wherein the duty cycle of the step of selectively enabling a voltage is similar to the duty cycle of the step of selectively switching the transmission of thermal energy between the thermoelectric element and the first thermal sink.

31. A method of operating a thermoelectric cooling apparatus having a first thermal sink for dissipating thermal energy at a temperature above an ambient, a second thermal sink for absorbing thermal energy at a temperature below the ambient, and a thermoelectric element situated to be coupled between the first and second thermal sinks to transport thermal energy therebetween, comprising the steps of:

selectively switching the thermal conductance of the coupling between the thermoelectric element and the first thermal sink;

selectively switching the thermal conductance of the coupling between the thermoelectric element and the second thermal sink; and selectively enabling the thermoelectric element in relative functional synchronism with the selective switching steps.

32. The method recited in claim 31, wherein the step of selectively enabling comprises a switching of a voltage across the thermoelectric element.

33. The method recited in claim 32, wherein at least one of the steps of selective switching the thermal conductance is accomplished with a microelectromechanical system (MEMS) device.

34. The method recited in claim 33, wherein the duty cycle of the step of selectively switching a voltage across correlates with the duty cycle of the step of selectively switching the thermal conductance of the coupling between the thermoelectric element and the second thermal sink.

* * * * *